United States Patent [19]

Kepler

[11] Patent Number: 5,795,820
[45] Date of Patent: Aug. 18, 1998

[54] METHOD FOR SIMPLIFYING THE MANUFACTURE OF AN INTERLAYER DIELECTRIC STACK

[75] Inventor: Nick Kepler, San Jose, Calif.

[73] Assignee: Advanced Micro Devices, Sunnyvale, Calif.

[21] Appl. No.: 673,005

[22] Filed: Jul. 1, 1996

[51] Int. Cl.$^6$ ................................................ H01L 21/441
[52] U.S. Cl. ...................... 438/624; 438/787; 438/790; 438/793
[58] Field of Search ........................... 437/195, 228, 437/235, 236; 438/624, 787, 789, 790, 791, 792, 793

[56] References Cited

U.S. PATENT DOCUMENTS

| | | | |
|---|---|---|---|
| 5,250,468 | 10/1993 | Matsuura et al. | 437/194 |
| 5,578,524 | 11/1996 | Fukase et al. | 437/195 |

FOREIGN PATENT DOCUMENTS

| | | |
|---|---|---|
| 0194950 A2 | 3/1986 | European Pat. Off. . |
| 0366 343 A2 | 5/1990 | European Pat. Off. . |
| 0523856 A3 | 1/1993 | European Pat. Off. . |

*Primary Examiner*—Caridad Everhart
*Attorney, Agent, or Firm*—David H. Jaffer

[57] ABSTRACT

A method and apparatus is provided for simplifying the manufacture of an interlayer dielectric where local interconnects are utilized. The invention utilizes a separate LI stack and first contact stack deposition and etch. In the first step, a layer of oxide etch stop and a layer of TEOS oxide are deposited to form a first LI stack. This stack is then contact etched, filled, and polished. A first contact stack is then formed by deposition of a doped silane oxide layer that is contact etched, filled, and polished. The method produces an ILD with a first layer of oxide etch stop, a second layer of undoped TEOS oxide, and a final layer of doped silane oxide.

21 Claims, 4 Drawing Sheets

METHOD FOR SIMPLIFYING THE MANUFACTURE OF AN INTERLAYER DIELECTRIC STACK

BACKGROUND OF THE INVENTION

1. Field of the Invention

The invention relates generally to a method for simplifying manufacture of a semiconductor device that includes an interlayer dielectric (ILD) stack and local interconnect (LI). In particular the invention relates to a method of manufacture that provides for separate LI and first contact etch and depositions. An oxide etch stop and an undoped silane oxide form a first LI stack that is etched and filled. A first contact stack of silane oxide is formed containing sections that are doped with phosphorous. This second stack is etched and then filled.

2. Brief Description of the Prior Art

Premetal interlayer dielectrics are typically used to isolate metal interconnect layers from underlying devices. Conventional methods for creating ILDs can include numerous fabrication steps in multiple processing tools, resulting in high production costs and high device defect rates due to the amount of handling required to complete the fabrication.

U.S. patent application Ser. No. 08 559,054, pending, streamlines this process by creating the ILD using in situ deposition in a single fabrication tool. This reduces the number of handling steps required to create an ILD. The method involves the deposition of a three layer ILD stack with a first layer of undoped silicon dioxide (generated from silane and oxygen) beneath a gettering layer of phosphorous doped silicon dioxide (also from silane and oxygen), followed by a final layer of undoped silicon dioxide (generated from TEOS and oxygen). Silicon dioxide created from silane and oxygen is referred to below as silane oxide, and silicon dioxide created from TEOS and oxygen is referred to below as TEOS oxide. The depositions are performed in situ with a single fabrication tool where each subsequent layer is deposited after the previous layer. No intervening handling steps are required.

When local interconnects (LIs) are added to this process, an oxide etch stop is required under the ILD. Addition of this etch stop results in a four layer stack where the etch stop is followed by the three layer ILD of undoped silane oxide, phosphorous-doped silane oxide, and undoped TEOS oxide. The four layer stack is difficult to etch because the four layers have different etch rates. Removing the doped silane layer would allow for more uniform contact etching resulting in more uniform contact (LI) opening for deposition of the LI. However, removal of the doped silane layer would also reduce the gettering capabilities of the ILD.

The method of the present invention resolves this problem by providing for two separate depositions and etches, and by moving the phosphorous doped silane oxide layer to a second stack. The undoped oxide and oxide etch stop are etched separately from the doped oxide. Two etch steps allow individual etching of the doped and undoped oxide layers under etch conditions designed to produce uniform contact openings.

SUMMARY OF THE INVENTION

It is therefore an object of the present invention to provide a method for simplifying manufacture of an interlayer dielectric stack.

It is a further object of the present invention to provide a method with two separate deposition and etch steps to manufacture an interlayer dielectric stack.

It is yet a further object of the present invention to provide a method for manufacturing an interlayer dielectric stack including an oxide etch stop, followed by a layer of undoped oxide, and a layer of doped oxide.

It is another object of the present invention to provide a method for manufacturing an interlayer dielectric stack, including a nitride etch stop, followed by a layer of TEOS oxide and a layer containing phosphorous doped silane oxide.

Briefly, the preferred embodiment of the present invention is a method for fabricating an ILD stack where local interconnects (LI) are used. Two stacks are deposited where the LI stack contains a nitride etch stop and an undoped TEOS oxide. The first contact stack contains silane oxide where some of the oxide has been doped with phosphorous.

IN THE DRAWINGS

FIG. 1 is a step by step cross-sectional view of the method of the present invention showing deposition of the interlayer dielectric.

DESCRIPTION OF THE PREFERRED EMBODIMENT

As described above, this invention provides a method for simplifying manufacture of an interlayer dielectric where local interconnects are utilized. The method utilizes two separate stack depositions and etches. In the first step, a layer of oxide etch stop and a layer of TEOS oxide are deposited to form a first LI stack. This stack is then contact etched, filled, and polished. A first contact stack is then formed by deposition of a doped silane oxide layer that is contact etched, filled, and polished. The method produces an ILD with a first layer of oxide etch stop, a second layer of undoped TEOS oxide, and a final layer of doped silane oxide.

Figure 1A:
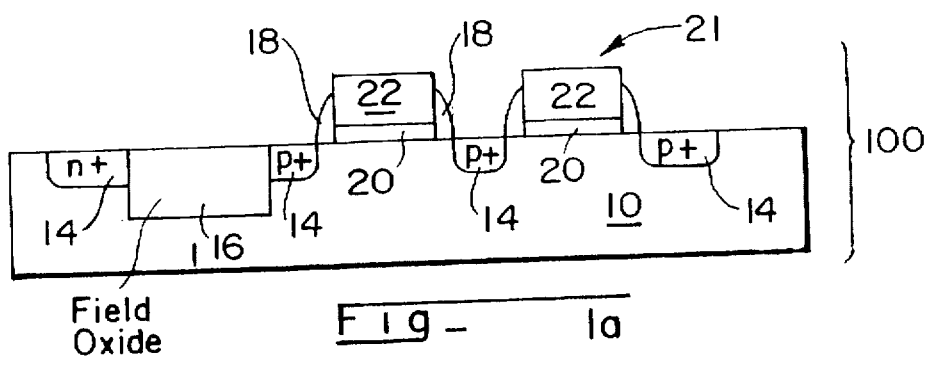
Fig. 1(a) shows a transistor before the method of the present invention.

FIG. 1(a) shows a cross-sectional view of a transistor 100 before the method of the present invention. The transistor includes a silicon substrate 10 with source drain (S/D) regions 14 and field oxide region 16. The field oxide region is used to isolate devices within the silicon substrate. S/D regions are interspersed throughout the silicon substrate and to define the transistor. A plurality of transistor gates 22 are positioned on the silicon substrate 10. A thin layer of silicon dioxide 20 provides insulation between the transistor gates and the substrate. Silicon dioxide spacers 18 provide for implantation of structures such as lightly doped drains.

Figure 1B:
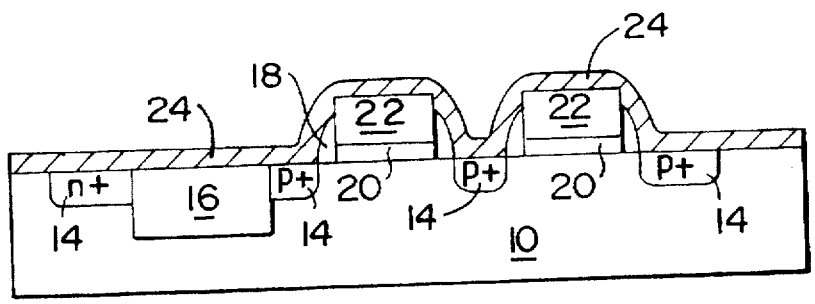
Fig. 1(b) shows deposition of the oxide etch stop layer.

Referring to Fig. 1(b), in the first step of the present invention a layer of oxide etch stop 24 is deposited over the silicon substrate and transistor gates. Many etch stops may be used to stop an oxide etch. In the preferred embodiment, the oxide etch stop is a layer of silicon nitride and is approximately 800 Angstroms (Å) thick.

Figure 1C:
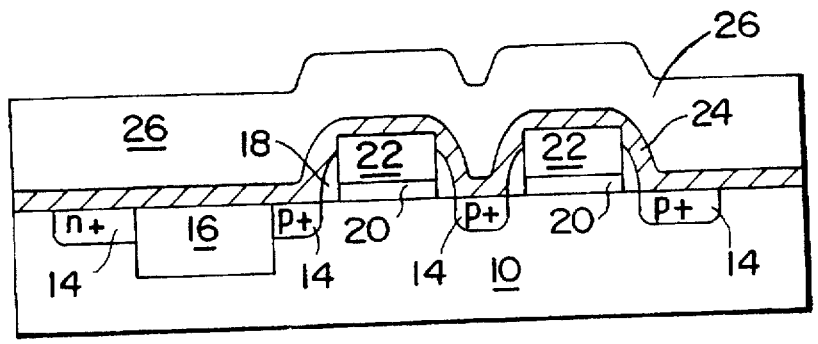
FIG. 1(c) shows deposition of the undoped oxide layer on top of the oxide etch stop.

In the second step shown in Fig. 1(c), an undoped oxide layer 26 is deposited over the oxide etch stop. The undoped oxide layer fills in the gaps between the closely spaced gates and physically isolates the doped oxide layer (to be deposited) from the gates. In the preferred embodiment, the undoped oxide is TEOS oxide generated from TEOS and oxygen.

Figure 1D:
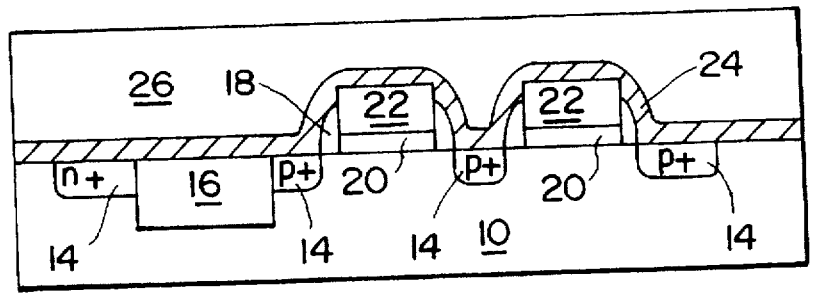
Fig. 1(d) shows the deposited first LI stack after polishing.

With reference to FIG. 1(d), after deposition of the undoped TEOS oxide layer, this first LI stack (silicon nitride and oxide) is polished to a thickness of 8,000 Å, where the undoped TEOS oxide layer is approximately 7,200 Å.

Figure 1E:
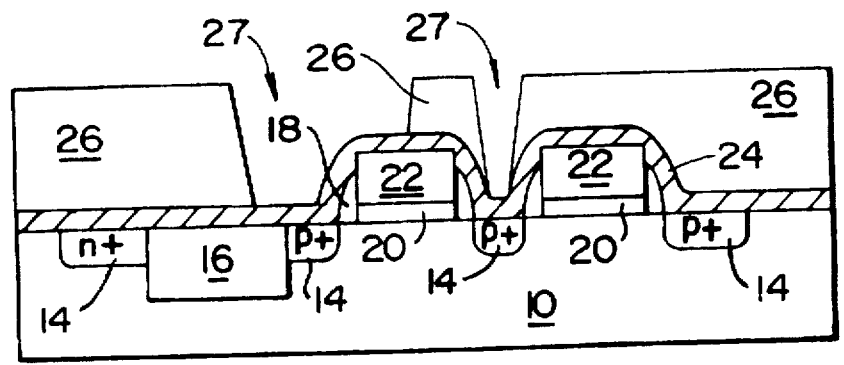
Fig. 1(e) shows etching of the undoped oxide layer.
Figure 1F:
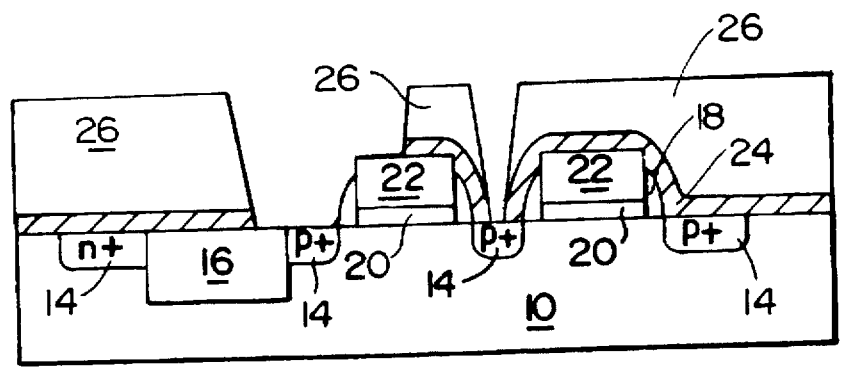
FIG. 1(f) shows etching of the oxide etch stop.

Referring to FIG. 1(e), after polishing, the undoped TEOS oxide is etched to form an LI contact opening 27. $C_4F_8/CH_3F/Ar$ is the preferred gas used in the TEOS oxide etch. Since an oxide selective etch may be used, silicon nitride 24 prevents etching further into the transistor. An etch is then performed on the nitride (see Fig. 1(f). The nitride etch stops on a gate (22), an S/D region 14, a field oxide 16, a spacer oxide 18, or any combination of the four. In the preferred embodiment, the nitride is etched using $CH_3F/O_2$.

Figure 1G:
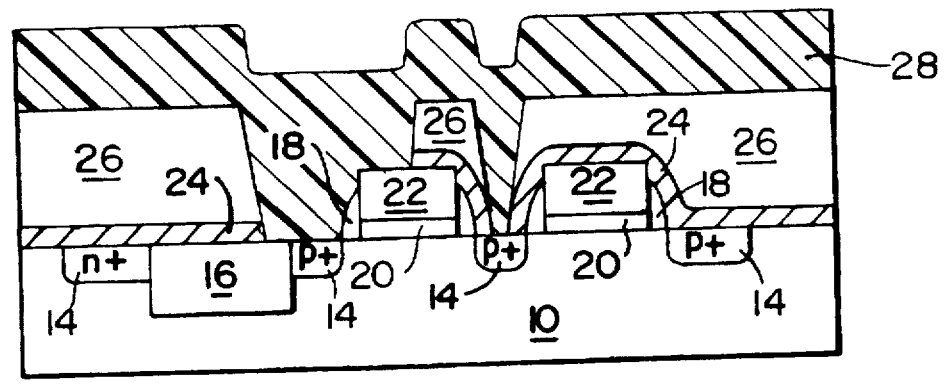
FIG. 1(g) shows deposition of the local interconnect.
Figure 1H:
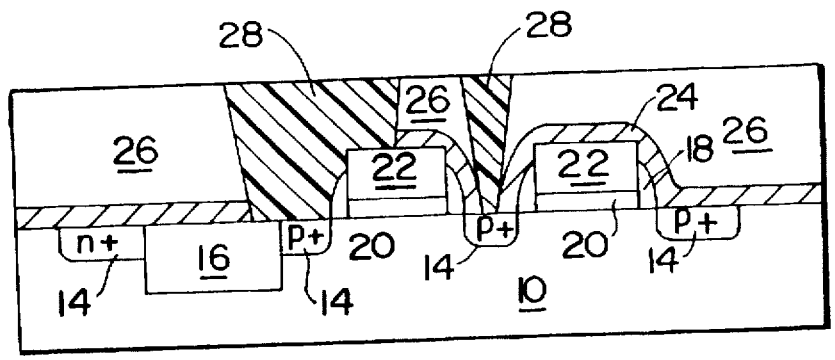
FIG. 1(h) shows the polished first LI stack, where the local interconnect stops on a gate (22), a source drain region (14), a field oxide (16), and a spacer oxide (18).

The next step, shown in FIG. 1(g), is deposition of the LI. A layer of Ti/TiN may be deposited prior to the LI deposition to improve adhesion of the LI to the underlying components. Local interconnect 28 contacts a gate, S D region, field oxide, etc. In the preferred embodiment, the LI is tungsten deposited from $WF_6$. As shown in FIG. 1(h), the tungsten LI is now polished to a total thickness of approximately 8,000 Å.

The first LI stack has now been deposited, etched, and filled.

Figure 1I:
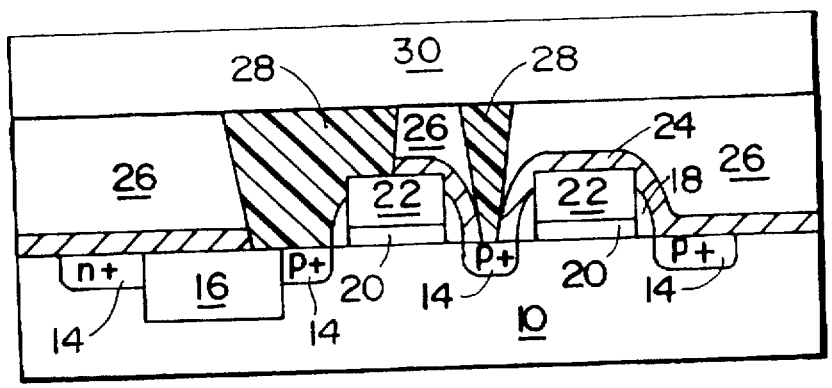
Fig. 1(i) shows deposition of a second oxide layer.

The next step of the present invention is deposition of a second oxide layer that is doped. In the preferred embodiment, the oxide is silane oxide generated from silane and oxygen and the dopant is phosphorous. Fig. 1(i) shows doped silane oxide layer 30 which is approximately 12,000 Å thick. The doped silane oxide layer provides for gettering above the gates and below the metal layer and reduces migration of impurities such as hydrogen or other mobile contaminates.

Figure 1J:
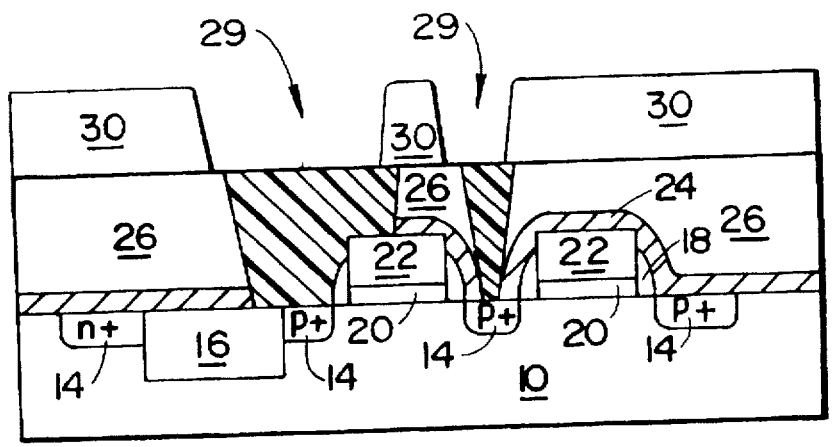
FIG. 1(j) shows contact hole etching of the second oxide layer.

The phosphorous containing doped silane oxide layer is then oxide etched providing contact opening 29. FIG. 1(j) shows the results of this etching.

Figure 1K:
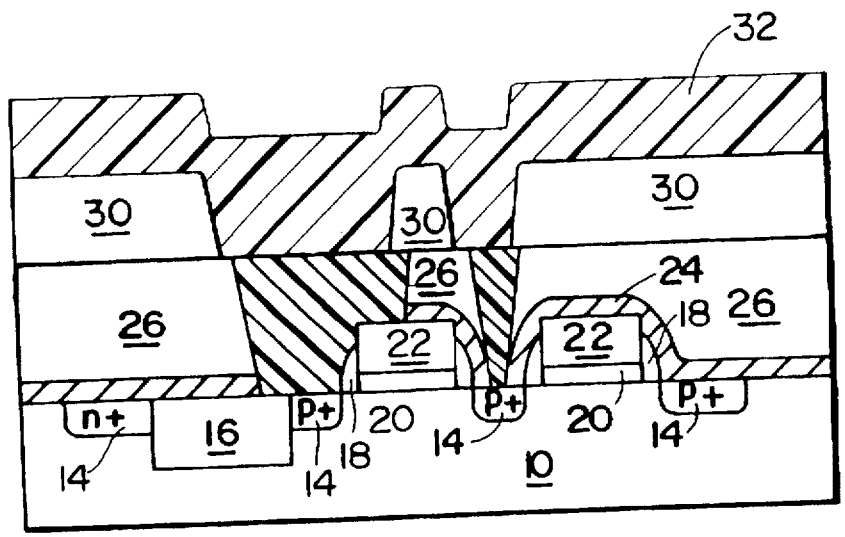
Fig. 1(k) shows deposition of the plug metal.
Figure 1L:
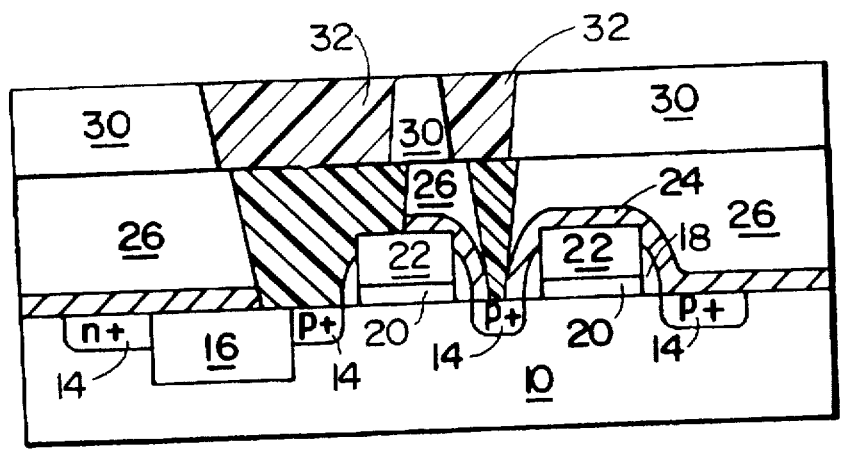
FIG. 1(l) shows the finished ILD after a final polishing.

After etching, a plug metal is deposited. FIG. 1(k) shows deposition of the plug metal 32. The layer is now polished to provide a plug thickness of approximately 12,000Å (see FIG. 1(1). FIG. 1(1) shows the completed ILD.

The method of the present invention is thus comprised of the deposition and etching of two stacks which may be followed by deposition of a plug metal. The first LI stack is formed by deposition of an etch stop and undoped oxide where the stack is then etched twice. The first contact stack includes a layer of doped oxide which is deposited and etched.

In the preferred embodiment, the silicon nitride deposition is conducted in an applied P5000 system with the pressure of the system maintained at 4.8 torr, RF power at 625 watts, susceptor T at 400 °C, and a gap of 540 mm. $SiH_4$, $NH_3$, and $N_2$ gases are used at 167 sccm, 130 sccm, and 3000 sccm respectively. Deposition of silicon nitride continues for approximately 8 seconds to obtain an 800Å coating.

The nitride step is followed by deposition of the undoped TEOS oxide. In the preferred embodiment, a Novellus Concept 1 PECVD reactor is used to prepare the oxide layers in a silane or TEOS based system. Reactant gases include silane, nitrous oxide, molecular nitrogen, molecular oxygen, and TEOS. TEOS and oxygen are flowed into the reactor at selected pressures and RF powers. In the preferred embodiment, the TEOS flow rate is approximately 2.3 ml min., although flow rates of from about 2.1 ml min to about 2.5 ml min. are suitable. The oxygen flow rate is approximately 9.5 slm, although flow rates of from about 9.2 slm to about 9.8 slm are suitable. High frequency power is applied at approximately 600 watts and low frequency power at approximately 400 watts although wattages that vary from these values by plus or minus about five percent are also suitable. The pressure is about 2.2 torr although pressures from about 2.0 torr to about 2.4 torr are suitable. The deposition temperature is about 400 ° C. Deposition of the undoped TEOS oxide continues for approximately 215 seconds.

After deposition of the undoped TEOS oxide, the oxide layer is etched followed by etching of the nitride layer. This is followed by a contact LI fill and polish.

After deposition and polish of the first LI stack, the first contact stack is deposited. The second LI stack is silane oxide containing layers which are doped with phosphorous. In the preferred embodiment, the silane flow rate is approximately 200 sccm although flow rates from about 190 sccm to about 220 sccm are suitable. The phosphene flow rate is approximately 320 sccm, although flow rates from about 305 sccm to about 335 sccm are suitable. The phosphorous is turned on and off during deposition to produce layers within the silane oxide which are doped. The nitrous oxide flow rate is approximately 6000 sccm, although flow rates from about 5700 sccm to about 6300 are suitable. The nitrogen flow rate is approximately 2700 sccm, although flow rates from about 2550 sccm to about 2850 sccm are suitable. High frequency power is applied at approximately 600 watts and low frequency power at approximately 400 watts although wattages that vary from these values by plus or minus five percent are also suitable. The pressure is about 2.2 torr although pressures from about 2.0 torr to about 2.4 torr are suitable. The deposition temperature is about 400° C. and continues for approximately 85 seconds.

The doped silane oxide layer is now etched, metal filled and polished. Providing a separate etch for the doped oxide layer allows the etch conditions to be individually tailored to the doped layer. This allows for a uniform metal contact opening.

All of the oxide deposition steps described above take place in sequence in a single PECVD reactor so that handling of the semiconductor wafers is minimized. The LI etches are conducted in an Applied Centura etch tool and the plug metal deposition is conducted in an Applied Endura deposition tool. This reduction in handling results in a very low defect rate. Also, in the in situ deposition, the semiconductor wafer is kept under continuous vacuum. Because the wafer is under constant vacuum, cleaning between depositions of the constituent layers is not necessary.

In another preferred embodiment of the present invention, an undoped silane oxide layer is deposited above the doped silane oxide layer. This is advantageous for adhesion of the metal to the dielectric layer.

Although the present invention has been described above in terms of specific embodiments, it is anticipated that alterations and modifications will become apparent to those skilled in the art. It is therefore intended that the following claims be interpreted as covering all alterations and modifications that fall within the true spirit and scope of the invention.

What is claimed is:

1. A method for manufacturing an interlayer dielectric (ILD) stack in a semiconductor device comprising the steps of:

(a) depositing a layer of oxide etch stop over a silicon substrate at a pressure of less than 50 torr;

(b) depositing a first layer of undoped oxide over the oxide etch stop at a pressure of less than 50 torr;

(c) etching a portion of the first layer of oxide to the oxide etch stop;

(d) etching a portion of the oxide etch stop to the silicon substrate thereby forming a first local interconnect (LI) stack including a first LI opening;

(e) depositing LI wiring to fill the first LI opening;

(f) depositing a second layer of doped oxide over the first LI stack at a pressure of less than 50 torr;

(g) etching a portion of the second oxide layer to form a first contact stack including a first contact opening;

(h) depositing a plug metal into the first contact opening thereby forming an ILD stack.

2. The method of claim 1 where the oxide etch stop is a layer of silicon nitride.

3. The method of claim 2 where the silicon nitride layer is deposited to a thickness of from about 500Å to about 1500Å.

4. The method of claim 3 where the silicon nitride layer is deposited to a thickness of approximately 800 Å.

5. The method of claim 1 where the silicon substrate contains transistor gates, field oxides and oxide spacers.

6. The method of claim 1 where the first layer of oxide is generated from TEOS and oxygen forming TEOS oxide.

7. The method of claim 6 where the TEOS oxide is polished to a thickness of approximately 8,000Å.

8. The method of claim 1 where the LI wiring is tungsten.

9. The method of claim 1 where the second layer of oxide is generated from silane and oxygen forming silane oxide.

10. The method of claim 9 where the silane oxide is deposited to a thickness of from about 10,000 to about 14,000Å.

11. The method of claim 10 where the silane oxide is deposited to a thickness of approximately 12,000Å.

12. The method of claim 1 where dopant is phosphorous.

13. The method of claim 12 where the silane oxide is doped in layers within the undoped silane oxide.

14. The method of claim 1 where a third layer of oxide is deposited after the second layer of oxide is deposited.

15. The method of claim 14 where the second and third layers of oxide are etched at the same time to form a first contact stack including a first contact opening.

16. The method of claim 15 where the third layer of oxide is not doped.

17. The method of claim 16 where the third layer of oxide is generated from TEOS and oxygen.

18. A method as recited in claim 1 further comprising the step of polishing said LI wiring after said depositing said LI wiring into the first LI opening.

19. A method as recited in claim 18 further comprising the step of polishing said plug metal after the step of depositing a plug metal into the first contact opening, and therefore forming an ILD stack.

20. A method for manufacturing an interlayer dielectric (ILD) stack in a semiconductor device comprising the steps of:

(a) depositing a layer of oxide etch stop over a silicon substrate;

(b) depositing a first layer of undoped TEOS oxide at a pressure in the range of 1 to 6 torr over the oxide etch stop;

(c) etching a portion of the first layer of oxide to the oxide etch stop;

(d) etching a portion of the oxide etch stop to the silicon substrate thereby forming a first local interconnect (LI) stack including a first LI opening;

(e) depositing LI wiring into the first LI opening;

(f) depositing a second layer of doped oxide over the first LI stack;

(g) etching a portion of the second oxide layer to form a first contact stack including a first contact opening;

(h) depositing a plug metal into the first contact opening thereby forming an ILD stack.

21. The method of claim 20 where the oxide etch stop is a layer of silicon nitride.

* * * * *